(12) United States Patent
Kondoh et al.

(10) Patent No.: US 6,337,661 B1
(45) Date of Patent: Jan. 8, 2002

(54) HIGH FREQUENCY COMMUNICATION DEVICE

(75) Inventors: Hiroshi Kondoh, Fucyu; Hiroshi Shinoda, Hachioji; Kenji Sekine, Hinode, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/557,827

(22) Filed: Apr. 25, 2000

(30) Foreign Application Priority Data

Apr. 26, 1999 (JP) .......................................... 11-118047

(51) Int. Cl.[7] ................................................ H01Q 1/38
(52) U.S. Cl. ............................... 343/700 MS; 343/841
(58) Field of Search .......................... 343/853, 700 MS, 343/702, 705, 701, 776, 778, 841, 805, 806; 333/245, 247, 248, 260

(56) References Cited

U.S. PATENT DOCUMENTS 4,771,294 A  *  9/1988  Wasilousky ................. 343/853
4,987,425 A  *  1/1991  Zahn et al. .................. 343/853
5,886,671 A  *  3/1999  Riemer et al. ............... 343/776
6,204,825 B1  *  3/2001  Wilz ............................ 343/841

* cited by examiner

Primary Examiner—Don Wong
Assistant Examiner—Chuc D. Tran
(74) Attorney, Agent, or Firm—Antonelli, Terry, Stout & Kraus, LLP

(57) ABSTRACT

A high frequency communication device which can reduce undesired electromagnetic coupling inside and outside a box thereof in which circuit parts constituting a transmitter-receiver circuit are contained. Periodic structures (6) are provided on at least a part of a wall constituting a box (1, 4, 5) so that the periodic structures (6) serve as a filter which has a non-propagating frequency band corresponding a frequency band covering an undesired electromagnetic emission inside the box. Thus, undesired electromagnetic emission energy from any electromagnetic emission source can be confined locally to prevent a possible problem of electromagnetic interference.

17 Claims, 7 Drawing Sheets

HIGH FREQUENCY COMMUNICATION DEVICE

FIELD OF THE INVENTION

The present invention relates to a high frequency communication device, and more particularly to a high frequency communication device having a box in which a high frequency circuit element for processing signals in a frequency band of microwaves or millimeter waves is mounted.

BACKGROUND OF THE INVENTION

In an automobile radar device using millimeter wave signals or in a high frequency wireless communication device or wireless terminal device using radio wave signals in a frequency band of 300 MHz or higher, a box thereof is so structured as to contain a single multi-function semiconductor element or integrated circuit (IC), a package comprising a plurality of ICs, or a high frequency circuit element comprising a plurality of mutually connected ICs including circuits for filtering and other functions for the purpose of realizing reduction in size and cost and incorporating multiple circuit functions.

As an example of a communication device having such a structure as mentioned above, there is an automobile radar transmitter-receiver reported in the Proceedings of the 1997 Institute IEICE Conference C-2-121 "60 GHz Band Millimeter Radar Unit". This device is structured to contain a millimeter wave (60 GHz band) transmitter-receiver circuit in a box thereof having plane internal surfaces. As another example, there is an RF subsystem found at the lower part of the front page photograph of the Catalog "RF, Microwave and Millimeter Wave, Single and Multi-Function Components and Subassemblies" of M/A-COM Co. U.S.A., issued in 1996. This RF subsystem is so designed that a plurality of high frequency (RF) function circuit elements are contained in a box thereof, which is partitioned into a plurality of areas by internal metallic walls for reducing possible electromagnetic interference among the function circuit elements.

Further, as another example, there is a transmitter-receiver reported in the Proceedings of the APMC98 Conference TU1A-3 "An Integrated Millimeter Wave MMIC Transceiver for 38 GHz Band" (in 1998). In this transmitter-receiver, a box thereof contains a plurality of transmitting-receiving MMICs and a dielectric substrate having passive circuits for connecting the MMICs, and the cover of the box is arranged to provide grooves for signal propagation.

Still further, as another example, there is a communication device reported in the Proceedings of the APMC98 Conference TU1A-1 "A Cost-Effective RF-Module for Millimeter-Wave Systems" (in 1998). This communication device is so structured that a box thereof contains a communication MMIC, a circuit substrate having passive circuits for connecting the MMIC, and a planar antenna.

Where a plurality of function elements are contained in a single box structure, physical distances among the function elements are shortened as the number of function elements is increased under condition that the size of the box is constant. Alternatively, with an increase in the number of function elements, it is required to increase the size of the box with respect to half of a free-space wavelength of a signal frequency (e.g., approximately 1.95 mm at 77 GHz). In either case, electromagnetic energy of a signal frequency emitted from a point of any function element or IC into the inside of the box readily propagates to another function element contained in the box through space therein, causing a variety of malfunctions due to electromagnetic coupling. For instance, in a transmitter-receiver or a millimeter-wave automobile radar transmitter-receiver module, if a part of a signal emitted from a transmitting function element into the inside of a box thereof propagates to a receiving function element contained in the box, there occurs such a trouble as saturation of a receiver circuit or increased noise in the receiver circuit. In particular, where the size of a box is considerably large with respect to half of a free-space wavelength of a signal frequency, a multiplicity of resonance frequencies signal components may be present in the inside of the box to worsen a condition of such a trouble as mentioned above.

Similarly to these phenomena, undesired energy emitted into the inside of a box readily causes undesired emission out of the box which unintentionally serves as a kind of antenna. On the contrary, external electromagnetic energy is likely to be received through the box, giving rise to a serious problem in requirements concerning EMI (Electro-Magnetic Interference) and EMC (Electro-Magnetic Compatibility).

To alleviate these problems, particularly electromagnetic interference in the inside of a box, a conventional communication device using such prior art as aforementioned has a box structure which is divided into a plurality of small areas by metallic partitions or a metallic box structure which provides local cut-off waveguides along signal paths for protection against undesired emission. In implementation of these conventional techniques, it is required to form a complex metallic box structure or to divide a high frequency passive circuit substrate into a plurality of sections. Further, due to formation of the complex metallic box structure or division of the passive circuit substrate, there occurs difficulty in mounting arrangement of semiconductor ICs and passive circuit parts, resulting in hindrance to mass-production of communication devices and reduction in manufacturing cost thereof.

SUMMARY OF THE INVENTION

It is therefore an object of the present invention to provide a high frequency communication device which can reduce electromagnetic interference inside and outside a box thereof, i.e., undesired electromagnetic coupling among internal circuit elements in the box and undesired interference with the internal circuit elements by an external electromagnetic wave, without giving hindrance to mass-production and reduction in manufacturing cost.

In accomplishing this object of the present invention and according to one aspect thereof, there is provided a high frequency communication device having an antenna and a box containing at least a high frequency circuit element which operates with a high frequency signal in a microwave or millimeter wave frequency band, wherein at least a part of a wall constituting the box has at least one periodic structure which provide a periodic pattern of materials or mechanical configurations. The periodic structures in the box are formed to serve as a filter which has a non-propagating frequency band corresponding to a frequency band covering an undesired electromagnetic emission inside the box.

The high frequency communication device may be any of a receiver device, a transmitter device, and a transmitter-receiver device. The high frequency circuit element may be any of a passive element, an IC, an LSI, and a package containing them, including lines for connection thereof. The antenna may be disposed at any position in the inside or outside of the box or on a wall surface of the box. "At least a part of a wall constituting the box" in the above statement signifies at least a part of a side wall of the box, a part of the ceiling part thereof, or a part of a mounting surface of a function element such as a semiconductor IC.

In the high frequency communication device according to the present invention, simple periodic structures are formed on a part of the box thereof to confine undesired electromagnetic emission energy locally in the inside of the box. This arrangement substantially reduces interference due to undesired electromagnetic emission energy to prevent a possible problem in requirements concerning EMI and EMC, and also attenuates undesired emission energy received from an external electromagnetic emission source to suppress interference.

In a situation where a plurality of undesired electromagnetic emission frequencies may be present in the inside of the box, a plurality of interference problems can be solved by providing different kinds of periodic structures at respective parts in the box. Further, in a case where periodic structures are provided on the ceiling part of the box, for example, the ceiling part may be designed as a lid of the box. Thus, the other parts of the box may be arranged in a simple form (e.g., rectangular parallelepiped) which is considerably large with respect to half of a free-space wavelength of a signal frequency. This arrangement allows the use of a single large-sized high frequency circuit substrate for facilitating the mounting of semiconductor ICs in the box, thereby making it possible to realize a module including the box at low cost.

According to the present invention, it is therefore practicable to realize an advanced multi-function high frequency communication system at low cost without sacrificing overall characteristics thereof. Further, since a filter characteristic based on periodic structures may be provided in a design independent of secure metallic contacting in most cases, the present invention makes it possible to reduce variations in mass-production and deterioration with age concerning characteristics of box products for high frequency transceivers such as millimeter wave automobile radar devices.

The above-mentioned and other features and objects of the present invention will become more apparent by reference to the following description taken in conjunction with the accompanying drawings.

DETAILED DESCRIPTION OF THE PREFERRED EMBODIMENTS

The present invention will now be described in detail by way of example with reference to the accompanying drawings.

Figure 1:
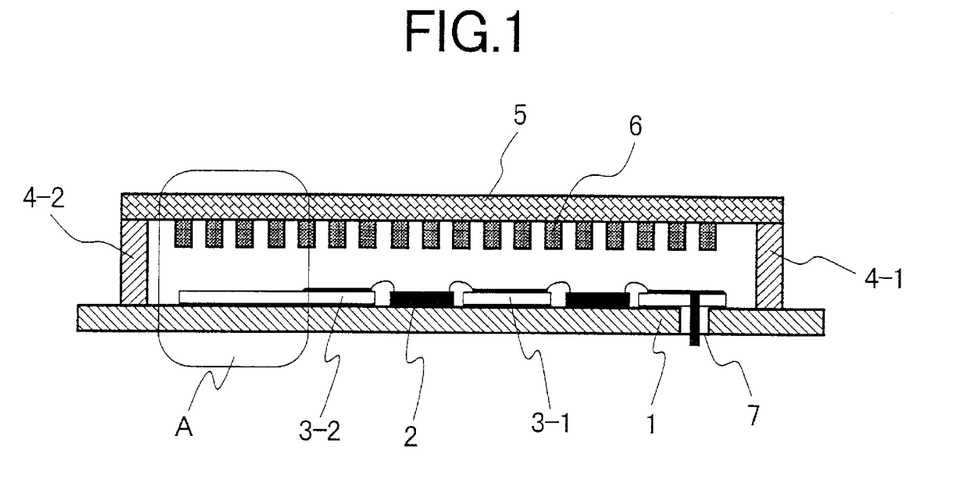
FIG. 1 is a sectional view showing a first preferred embodiment of a high frequency communication device designed as a microwave or millimeter wave transmitter-receiver according to the present invention.

Referring to FIG. 1, there is shown a sectional view of a first preferred embodiment of a high frequency communication device designed as a microwave or millimeter wave transmitter-receiver according to the present invention. Semiconductor ICs 2 such as a transmitting-receiving MMIC and planar circuit substrates 3-1 and 3-2 for connection thereof are mounted on the surface of a metallic base plate 1 used as the bottom part of a box to constitute a transmitter-receiver circuit. For input/output signaling, the transmitter-receiver circuit is connected with an antenna (not shown) through a coaxial line 7. A metallic lid 5, which is separated from the base plate 1 by side walls 4-1 and 4-1, constitutes the ceiling part of the box. The side walls of the box may be made of a metallic material or a nonmetallic material such as glass or alumina. On the ceiling part used as the lid 5 which faces the inside of the box, there are disposed rectangular-parallelepiped metallic protrusions 6 in a periodic fashion.

The base plate 1 is made of a nonmetallic material such as plastic or alumina, and at least a surface of the base plate 1 on which the MMIC and the planar circuit substrates are mounted is covered with a metal thin film by means of plating or evaporation. The protrusions 6 may be integrally formed with the lid 5 by means of machining, molding or metal pressing. Alternatively, the metallic protrusions 6 may be formed separately and then attached to the back of the lid with a conductive adhesive. In another manner, the ceiling part including the metallic protrusions 5 may be formed by pressing a metallic sheet and then providing a backing thereon using another metallic or nonmetallic sheet for ensuring satisfactory mechanical strength. Further, as in the case of the base plate 1, a nonmetallic material such as plastic may be used to form an integral structure of the metallic protrusions 6 and the lid 5. In this case, at least a surface of the ceiling part inside the box, including the metallic protrusions 6, is covered with a metal thin film by means of plating or the like.

The ceiling part thus formed to have a metallic surface with periodic unevenness, in conjunction with the metallic surface on which the transmitter-receiver circuit is mounted, serves as a filter that has a characteristic of periodically varying wave impedance to a microwave or millimeter wave to prevent propagation thereof through the inside space of the box. As a function of frequency, this filter provides a characteristic having a propagating frequency band and a non-propagating frequency band alternately. Therefore, for example, by designing this kind of filter structure so that an operating frequency of the transmitter-receiver circuit will be in a range of the non-propagating frequency band, undesired electromagnetic emission from a transmitting side of the transmitter-receiver circuit into the inside of the box is prevented from reaching a receiving side thereof, thus making it possible to reduce transmission-reception interference.

Figure 2:
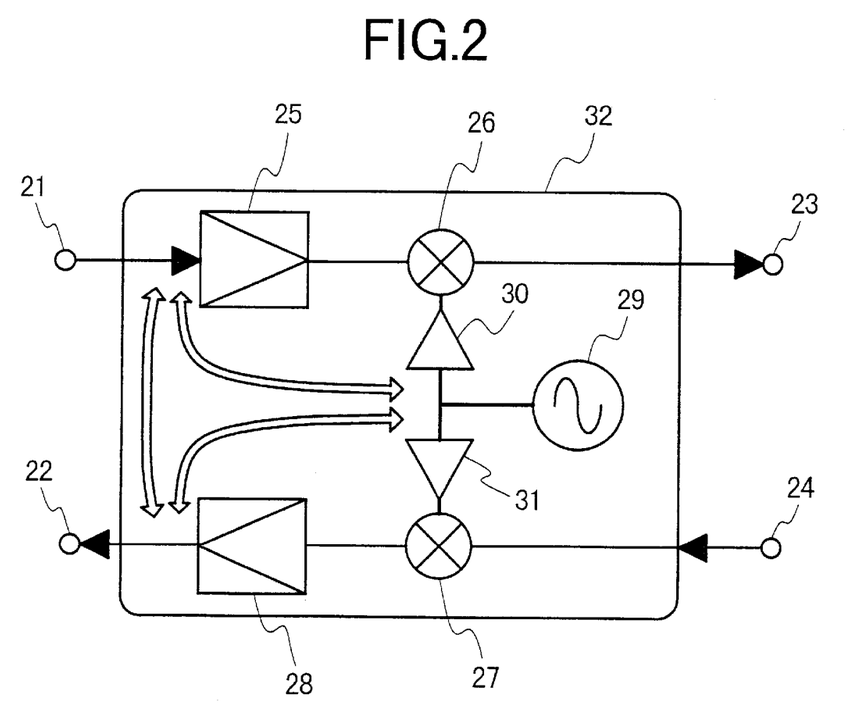
FIG. 2 is a block diagram showing a configuration example of a transmitter-receiver circuit mounted in a box of the high frequency communication device indicated in FIG. 1.

Referring to FIG. 2, there is shown a block diagram of a configuration example of a transmitter-receiver circuit mounted in the box of the high frequency communication device indicated in FIG. 1.

A received signal is applied via a receiving antenna terminal 21 and fed to a mixer 26 through a low noise amplifier 25. In the mixer 26, a high frequency signal supplied from a high frequency signal source 29 for frequency synthesis through a local amplifier 30 is mixed with the received signal to output an intermediate frequency signal via a terminal 23. An information signal to be transmitted is applied via a terminal 24 and fed to a modulator 27, in which the information signal is modulated with a high frequency signal supplied from the high frequency signal source 29 through a local amplifier 31. The signal thus modulated is amplified by a power amplifier 28 to deliver a high frequency transmission signal via a transmitting antenna 22. This circuit configuration is the same as that of a conventional high frequency transmitter-receiver circuit. Reference numeral 32 in FIG. 2 indicates a box. The double arrow lines in FIG. 2 indicate electromagnetic interference which would occur in a case where the present invention is not implemented. That is to say, a signal supplied from the high frequency signal source 29 directly interferes with a high frequency reception signal and a high frequency transmission signal. Further, interference takes place between the high frequency reception signal and the high frequency transmission signal. In the present invention, periodic structures serving as a filter for blocking the high frequency transmission signal are formed in the inside of the box 32 to reduce electromagnetic interference.

Figure 3:
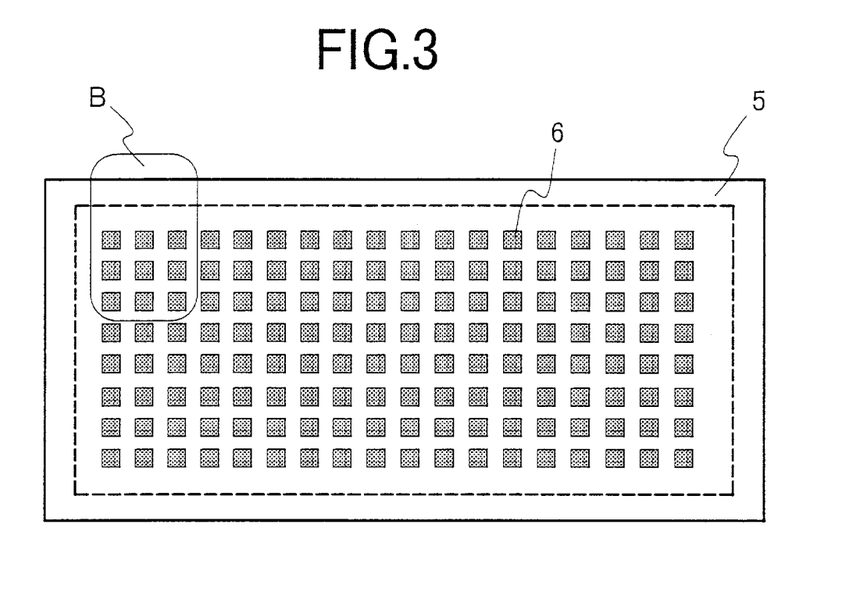
FIG. 3 is a plan view of a lid 5 as seen from the inside of the box indicated in FIG. 1 toward the ceiling part thereof.

Referring to FIG. 3, there is shown a plan view of the lid 5 as seem from the inside of the box indicated in FIG. 1 toward the ceiling part thereof. The metallic protrusions 6 are arranged two-dimensionally in a constantly periodic fashion on the entire surface of the ceiling part.

Figure 4:
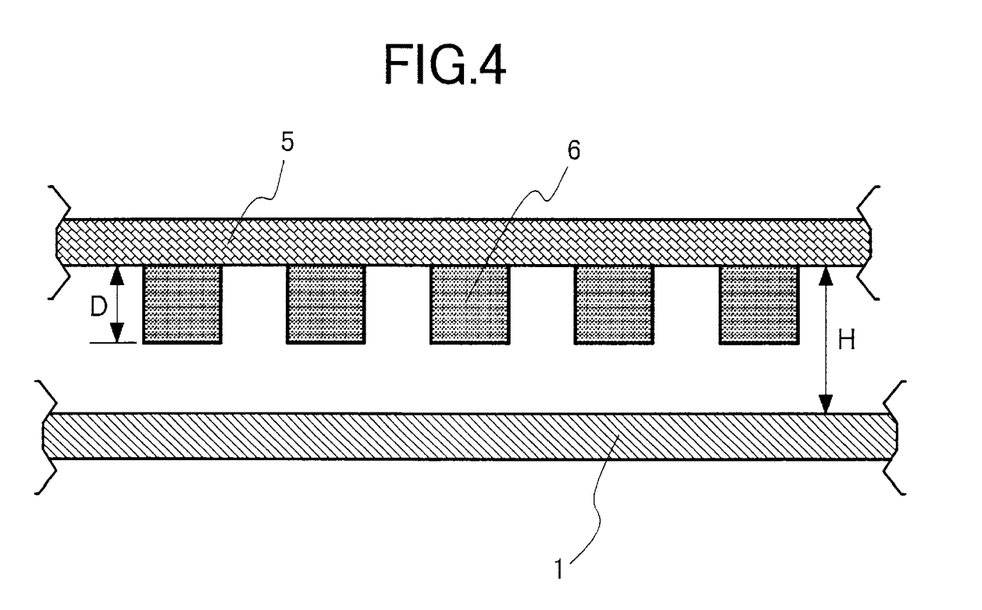
FIG. 4 is an enlarged view of part A indicated in FIG. 1 for explanation of the principle of operation of the essential arrangement of the present invention.
Figure 5:
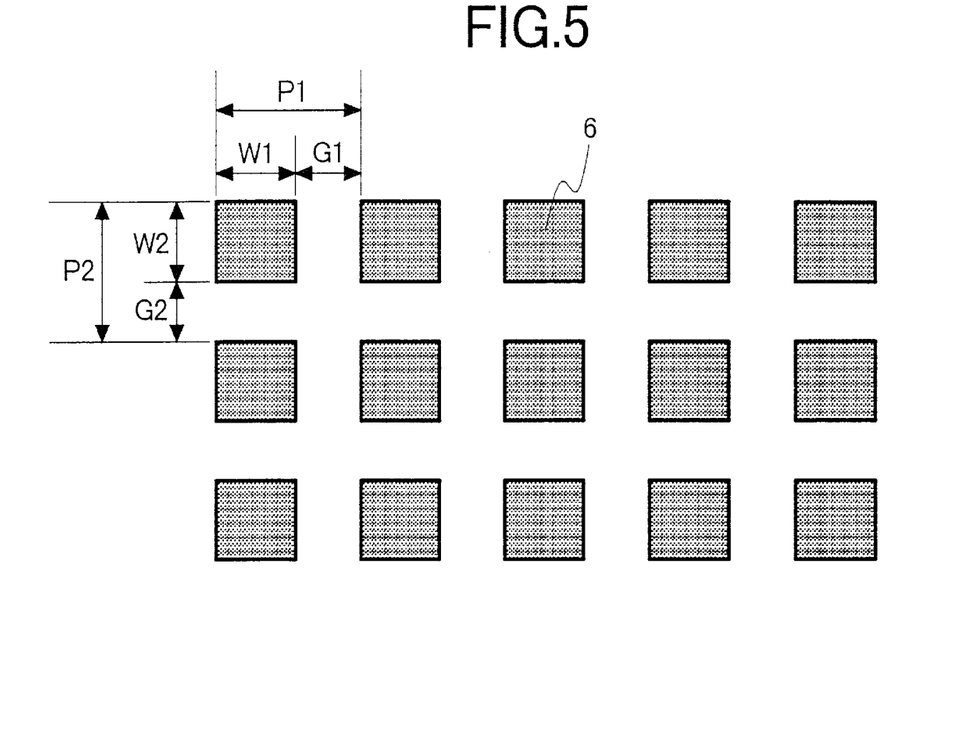
FIG. 5 is an enlarged view of part B indicated in FIG. 3 for explanation of the principle of operation of the essential arrangement of the present invention.

FIGS. 4 and 5 show enlarged views of parts A and B indicated in FIGS. 1 and 3, respectively, for explanation of the principle of operation of the essential arrangement of the present invention. For the sake of simplicity, only the ceiling part 5, the metallic protrusions and the base plate 1, excluding the planar circuit substrate 3-2, are shown in FIG. 4. Each of the metallic protrusions 6 indicated in FIGS. 4 and 5 is a rectangular parallelepiped having widths W1 and W2 and a height D. As shown in FIG. 5, the metallic protrusions 6 are disposed two-dimensionally at a horizontal period P1 and a vertical period P2 with a horizontal gap G1 and a vertical gap G2. In FIG. 4, a space H between the metallic lid 5 and the base plate 1 is provided so that an electromagnetic higher mode will not occur in the H direction. For maintaining a high characteristic of the filter structure, it is preferable to satisfy the condition "H<$\lambda$/2", where $\lambda$ is a free-space wavelength with respect to a design frequency.

Figure 6:
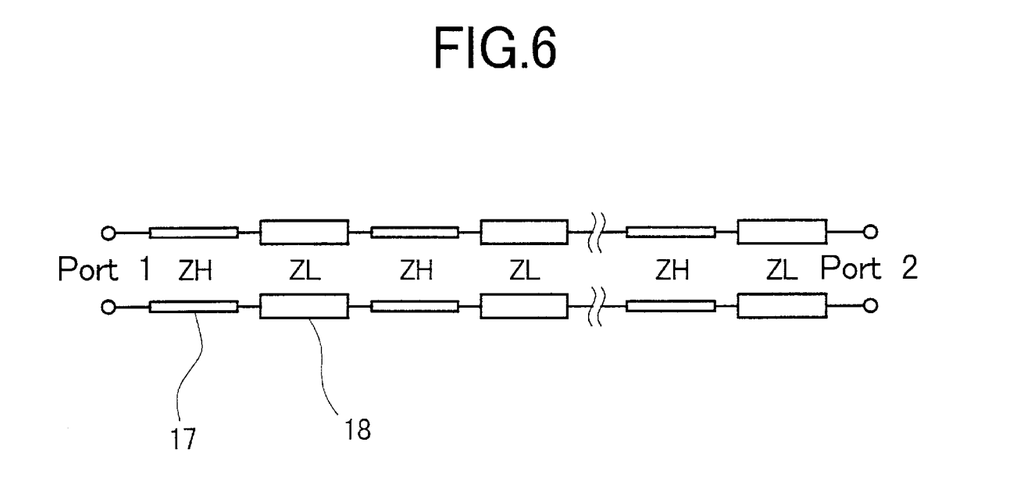
FIG. 6 is a diagram showing a simplified equivalent circuit for explanation of qualitative effects of periodic structures indicated in FIGS. 4 and 5.

Referring to FIG. 6, there is shown a simplified equivalent circuit for explanation of qualitative effects of the periodic structures indicated in FIGS. 4 and 5.

Under condition that each of the horizontal gap G1 and the width W1 of each metallic protrusion 6 is $\lambda$/4 without regard of an electromagnetic field distribution in the direction of the height D of each metallic protrusion 6 indicated in FIG. 4, the periodic structures act as a $\lambda$/4 impedance transformer in a continuous form comprising a region $Z_H$ of high wave impedance 17 with respect to a electromagnetic wave of a dominant propagating mode and a region $Z_L$ of low wave impedance 18 with respect thereto. At a center frequency (=c/$\lambda$, where "c" is the velocity of light), impedance in the direction from port 1 to port 2 is almost open or short-circuited regardless of a value of load impedance connected to the port 2, thereby preventing a high frequency component incident on the port 1 from propagating to the port 2.

In actual design practice, it is required to take account of effects to be given by an electromagnetic field distribution in the height-D direction and a higher propagating mode. It is also required to consider a practical wavelength expansion or compression rate based on a free-space wavelength $\lambda$ corresponding to a modified configuration of each metallic protrusion 6 indicated in FIG. 4. Each of the horizontal period P1 and the vertical period P2 should be in a range of "(2N+1) $\lambda$/5≦PERIOD (P1, P2)≦(2N+1) 5$\lambda$/9" (where N is 0 or an integer) under condition "D<H". Thus, a preset frequency can be provided in a non-propagating frequency band of the filter. Some of the metallic protrusions 6 indicated in FIG. 5 may be arranged in a group (e.g., three protrusions in the horizontal direction and two protrusions in the vertical direction) so that each group is provided periodically. In this arrangement, a non-propagating frequency band can be widened by designing grouped protrusions in different sizes.

Figure 7:
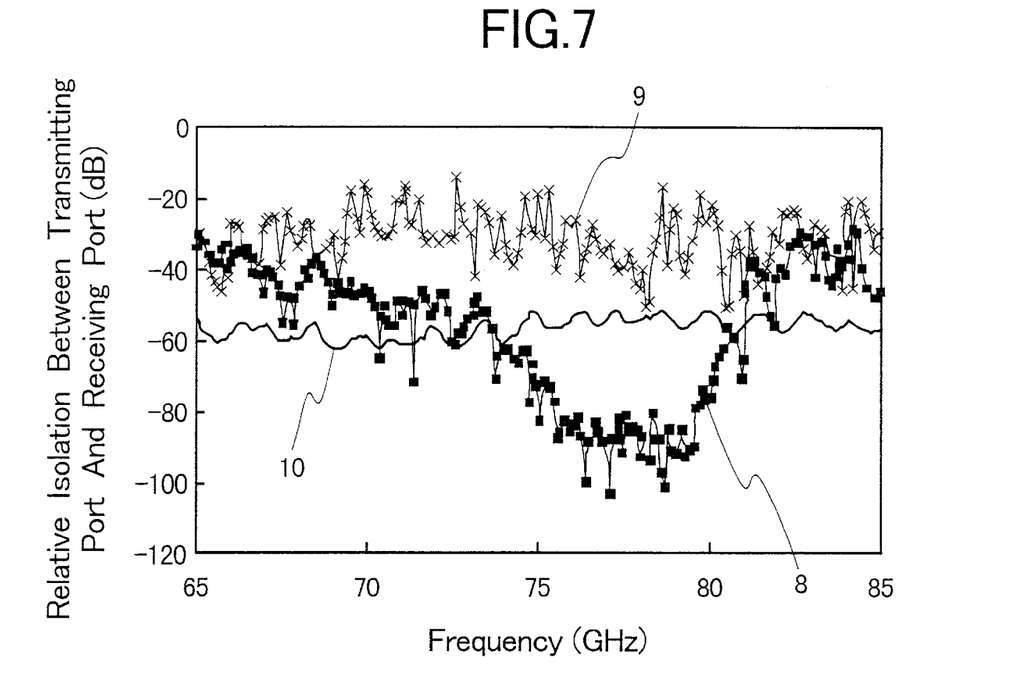
FIG. 7 is a diagram showing measured values of isolation between a transmitting port and a receiving port for representing effects in a configuration example of the first preferred embodiment.

Referring to FIG. 7, there is shown a diagram indicating measured values of isolation between transmitting and receiving ports for representing effects in the configuration example of the first preferred embodiment. In FIG. 7, a measured value line 8 indicates isolation between the transmitting and receiving ports of a box structure designed for a 77 GHz band transmitter-receiver according to the preferred embodiment mentioned above, a measured value line 9 indicates isolation in a box having a flat lid ceiling on which no periodic protrusions are formed, and a measured value line 10 indicates isolation in a box with a lid thereof removed. In the preferred embodiment of the present invention, the following structure design values are used: H=1.9 mm, D=0.8 mm, G1=G2=W1=W2=0.5 mm. The isolation indicated by the measured value line 8 in the box structure according to the preferred embodiment of the present invention is at least 30 dB higher in a 76 GHz band than either of the measured value line 9 in the box having the flat lid ceiling and the measured value line 10 in the box with the lid thereof removed.

Figure 8:
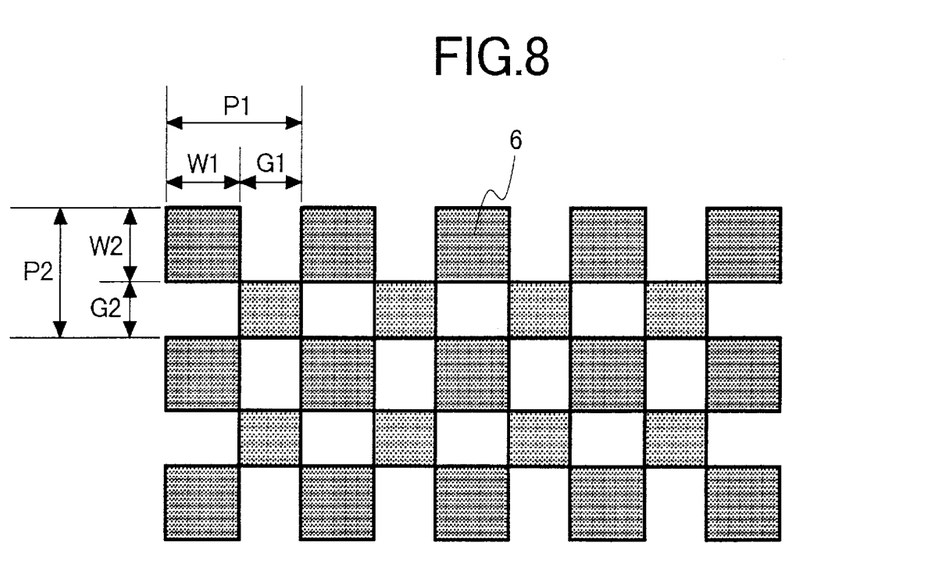
FIG. 8 is a fragmentary plan view showing an arrangement of protrusions in a second preferred embodiment of the high frequency communication device according to the present invention.

Referring to FIG. 8, there is shown a fragmentary plan view indicating an arrangement of protrusions in a second preferred embodiment of the high frequency communication device according to the present invention. In the second preferred embodiment, the metallic protrusions 6 are arranged in a checked pattern. The widths W1 and W1, height D, horizontal gap G1, vertical gap G2, horizontal period P1, and vertical period P2 of the metallic protrusions 6 are set as shown in FIG. 8. Thus, the same effects in the first preferred embodiment can also be attained in the second preferred embodiment.

Figure 9:
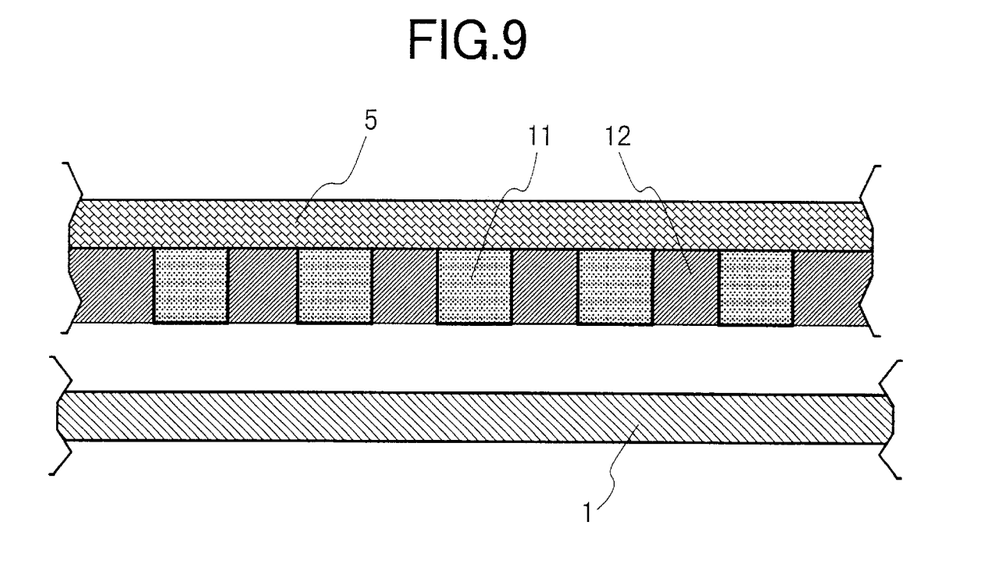
FIG. 9 is a fragmentary sectional view showing an arrangement of a periolic pattern in a third preferred embodiment of the high frequency communication device according to the present invention.

Referring to FIG. 9, there is shown a fragmentary sectional view indicating an arrangement of protrusions in a third preferred embodiment of the high frequency communication device according to the present invention. Although this sectional view is similar to that in FIG. 4, dielectric material protrusions 11 having high permittivity and dielectric material protrusions 12 having low permittivity are arranged alternately in a periodic fashion on the surface of the metallic lid 5 for periodic structures. Thus, periodic wave impedance is provided in the third preferred embodiment.

Figure 10:
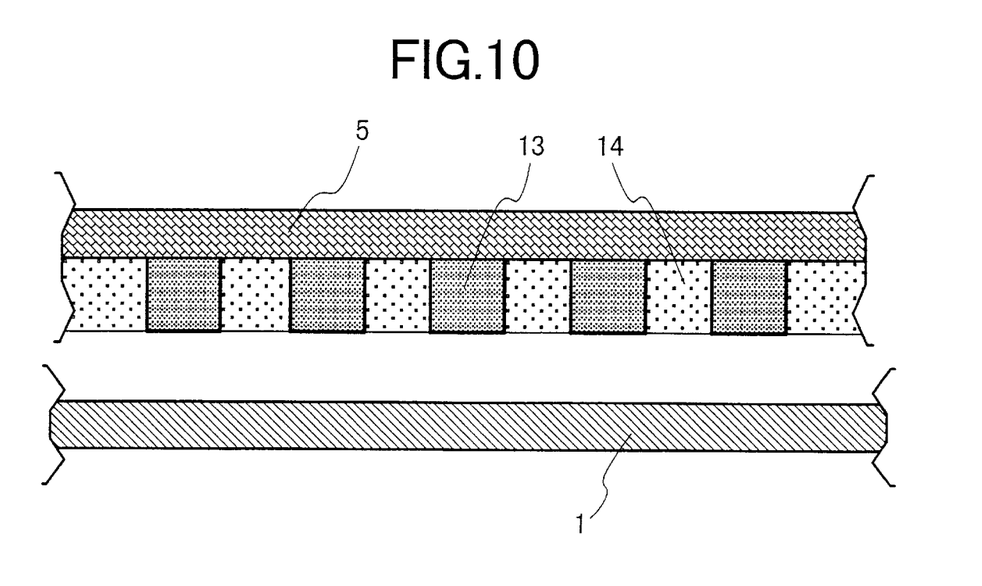
FIG. 10 is a fragmentary sectional view showing an arrangement of a periolic pattern in a fourth preferred embodiment of the high frequency communication device according to the present invention.

Referring to FIG. 10, there is shown a fragmentary sectional view indicating an arrangement of protrusions in a fourth preferred embodiment of the high frequency communication device according to the present invention. Although this sectional view is similar to that in FIG. 4, dielectric material protrusions 13 having high permittivity and magnetic material protrusions 14 having high magnetic permeability are arranged alternately in a periodic fashion on the surface of the metallic lid 5 for periodic structures. Thus, periodic wave impedance is provided in the fourth preferred embodiment.

Figure 11:
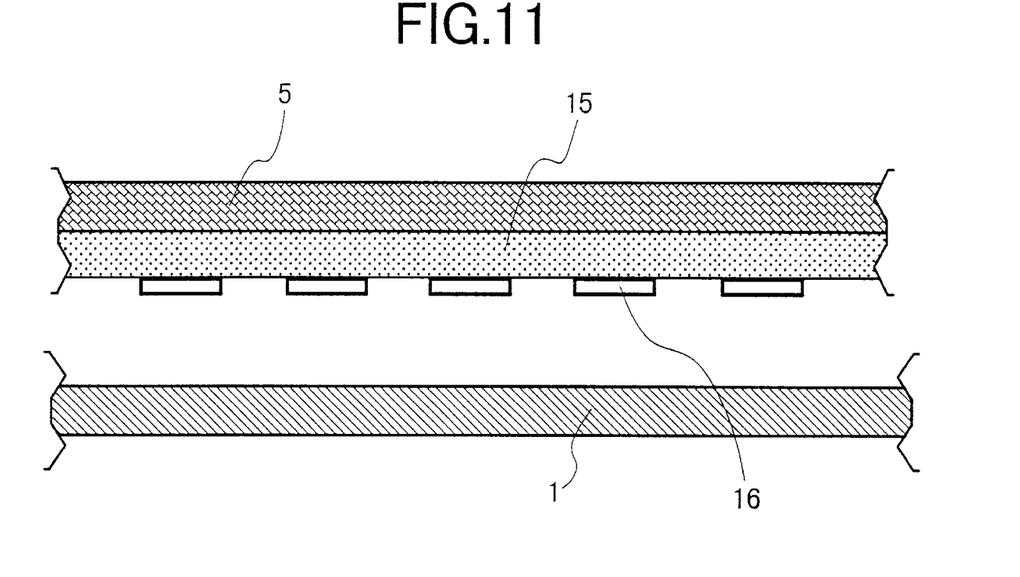
FIG. 11 is a fragmentary sectional view showing an arrangement of a periolic pattern in a fifth preferred embodiment of the high frequency communication device according to the present invention.

Referring to FIG. 11, there is shown a fragmentary sectional view indicating an arrangement of protrusions in a fifth preferred embodiment of the high frequency communication device according to the present invention. Although this sectional view is similar to that in FIG. 4, a metallic periodic pattern 16 is formed on the surface of a dielectric substrate 15 by means of etching or the like, and the dielectric substrate 15 is then attached to the surface of the metallic lid 5 for periodic structures. Between the dielectric substrate 15 and the metallic lid 5, there may be provided a gap such as a layer of air. The metallic periodic pattern 16 shown in FIG. 11 may have a variety of configurations for providing periodic wave impedance and for attaining necessary characteristics in a design frequency band.

Figure 12:
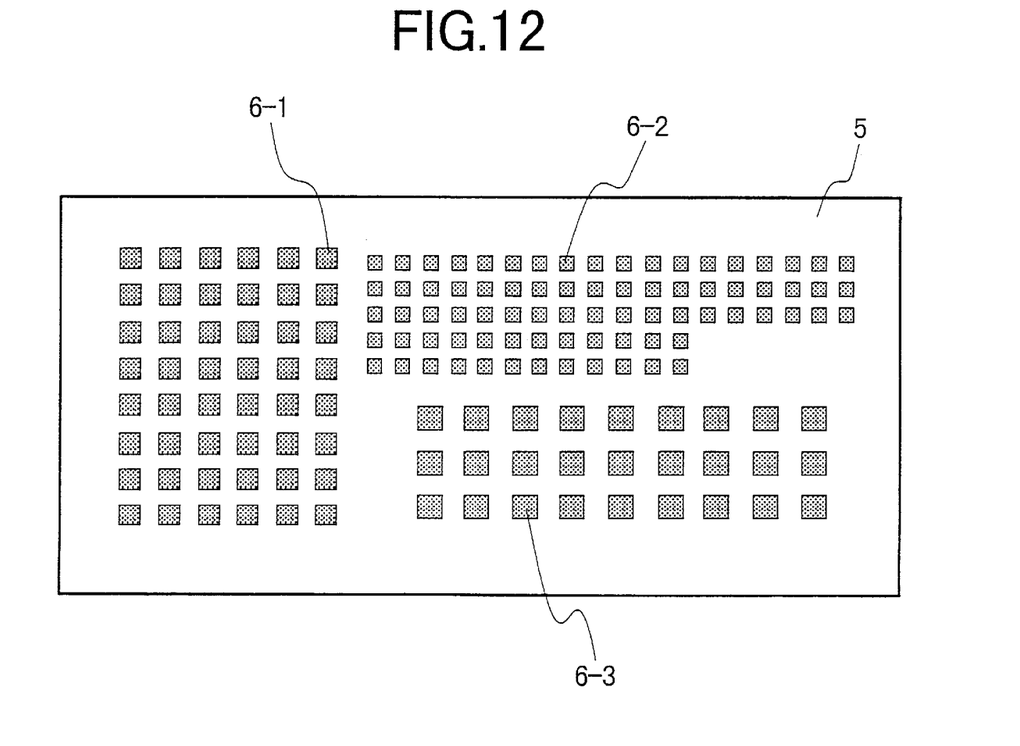
FIG. 12 is a plan view showing a layout on a metallic lid in a sixth preferred embodiment of the high frequency communication device according to the present invention.

Referring to FIG. 12, there is shown a plan view indicating a layout on a metallic lid in a sixth preferred embodiment of the high frequency communication device according to the present invention. In the sixth preferred embodiment, where there are three kinds of principal functions operating at three different frequencies in the inside of the box, metallic protrusions 6-1, 6-2 and 6-3 which are periodic structures for three different design frequencies are disposed respectively in three areas on the surface of the lid. Thus, interference among the three kinds of principal functions can be reduced effectively. More specifically, in each of the three areas, each period P of the periodic structures is in a range of "(2N+1) $\lambda/5 \leq P \leq (2N+1)$ $5\lambda/9$" (where N is 0 or an integer).

Figure 13:
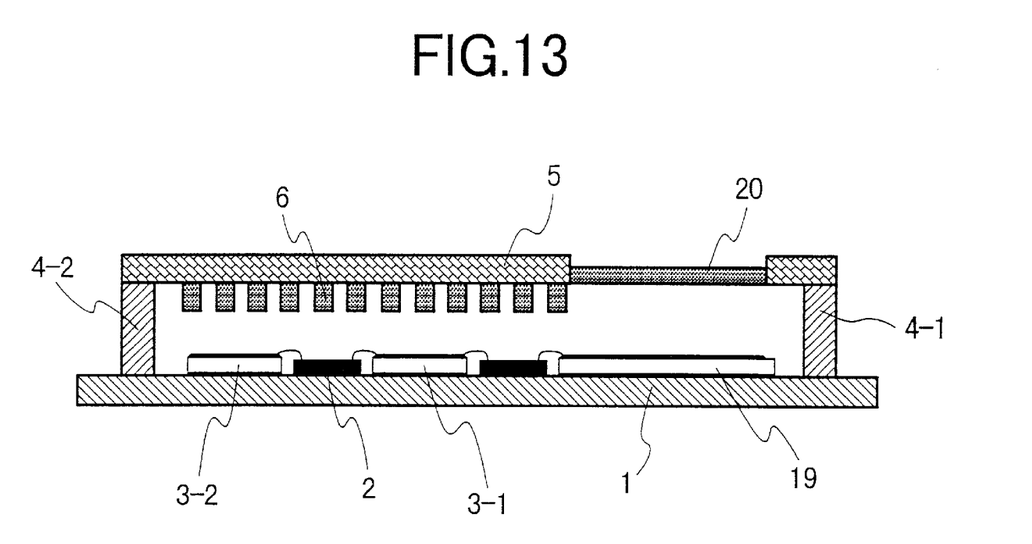
FIG. 13 is a sectional view showing a configuration of a seventh preferred embodiment of the high frequency communication device according to the present invention.

Referring to FIG. 13, there is shown a sectional view indicating a configuration of a seventh preferred embodiment of the high frequency communication device according to the present invention. As compared with the first preferred embodiment shown in FIG. 1, the seventh preferred embodiment is unique in that an antenna 19 is formed in the inside of a metallic box, i.e., on a substrate for an MMIC. Therefore, in the vicinity of the antenna 19, a window 20 is provided at a part of a wall constituting the metallic box. In the seventh preferred embodiment, since the antenna 19 is equipped in the box, it is possible to obviate a problem of mutual interference among an electromagnetic field around the antenna, an electromagnetic field around the transmitter-receiver circuit, and an electromagnetic field outside the box through the window 20 in realizing a compact type of communication device.

While the present invention has been described in detail with respect to specific embodiments thereof, it is to be understood that the present invention is not limited by any of the details of description and that various changes and modifications may be made in the present invention without departing from the spirit and scope thereof. For instance, the antenna may be formed on the back side of the metallic base plate 1. Further, although the protrusion 6 having a rectangular cross-section configuration has been used in the foregoing, the configuration of each protrusion may be modified as required in consideration of such factors as fabrication and filtering characteristics. For example, each protrusion may be a rectangular parallelepiped which is chamfered to provide curvature or a cylindrical form. Still further, the cross-section configuration of the ceiling part in FIG. 3 may be a corrugated form having a cosine-line surface, for example. Furthermore, each face of the rectangular-parallelepiped protrusion may have a complex shape with grooves. Still further, although the high frequency circuit element comprises the transmitter circuit and the receiver circuit in FIG. 2, there may be provided such a modified arrangement that the frequency circuit element comprises either one of the transmitter and receiver circuits.

What is claimed is:

1. A high frequency communication device comprising:
    a box containing at least one high frequency circuit element,
    wherein at least a part of a wall of said box has a periodic structure which provide a periodic pattern of materials of mechanical configurations for providing a filtering function to prevent undesired signal wave propagation of high frequency thorough the inside of said box.

2. A high frequency communication device according to claim 1,
    wherein said a periodic structure is formed on an inside wall of said box.

3. A high frequency communication device according to claim 2,
    wherein a period P of said periodic structures which provide a periodic pattern is in a range of "(2N+1) $\lambda/5 \leq P \leq (2N+1)$ $5\lambda/9$", where N is 0 or an integer, and $\lambda$ is a free-space wavelength with respect to a design frequency.

4. A high frequency communication device according to claim 2,
    wherein a plurality of groups of said periodic structures are disposed on a plurality of areas in said box, each said group of periodic structures being arranged to provide a periodic pattern, and
    wherein a period P of each said group of periodic structures on each said area in said box is in a range of "(2N+1) $\lambda/5 \leq P \leq (2N+1)$ $5\lambda/9$", where N is 0 or an integer, and $\lambda$ is a free-space wavelength with respect to a design frequency on each said area.

5. A high frequency communication device according to claim 1, which further comprises;
    an antenna is formed outside said box, and
    wherein said high frequency circuit element is provided with input and output terminals for connection with said antenna.

6. A high frequency communication device according to claim 1,
wherein said antenna is formed inside said box, and
wherein a window for passage of radio waves is provided on a wall of said box in the vicinity of said antenna.

7. A high frequency communication device according to claim 2,
wherein said antenna is formed outside said box, and
wherein said high frequency circuit element is provided with input and output terminals for connection with said antenna.

8. A high frequency communication device according to claim 3,
wherein said antenna is formed outside said box, and
wherein said high frequency circuit element is provided with input and output terminals for connection with said antenna.

9. A high frequency communication device according to claim 4,
wherein said antenna is formed outside said box, and
wherein said high frequency circuit element on each said area is provided with input and output terminals for connection with said antenna.

10. A high frequency communication device according to claim 2,
wherein said antenna is formed inside said box, and
wherein a window for passage of radio waves is provided on a wall of said box in the vicinity of said antenna.

11. A high frequency communication device according to claim 3,
wherein said antenna is formed inside said box, and
wherein a window for passage of radio waves is provided on a wall of said box in the vicinity of said antenna.

12. A high frequency communication device according to claim 4,
wherein said antenna is formed inside said box, and
wherein a window for passage of radio waves is provided on a wall of said box in the vicinity of said antenna.

13. A high frequency communication device, comprising:
a box formed of a plurality of walls and containing at least one transmitter-receiver circuit, said box further comprising:
a lid having a metallic surface with periodic metallic protrusions; and
a base plate, connected to said lid by at least one of said plurality of walls of said box, having a portion covered in a metal film on which the transmitter-receiver circuit is mounted, wherein the lid and base plate act as a filter which causes periodic varying wave impedance of microwave or millimeter waves to prevent propagation of the microwave or millimeter waves through the box.

14. A high frequency communication device, comprising:
a box formed of a plurality of walls and containing at least one high frequency circuit element, said box further comprising:
a first wall of the plurality of walls having a plurality of metallic protrusions; and
a second wall of the plurality of walls connected to the first wall, coated with a metal film on which the high frequency circuit element is mounted, wherein the first wall and the second wall are an impedance of microwave or millimeter waves.

15. The high frequency communication device as recited in claim 14, wherein the first wall is connected to the second wall through a third wall of the plurality of walls.

16. The high frequency communication device as recited in claim 15, wherein the first wall is a lid and the second wall is a base plate.

17. The high frequency communication device as recited in claim 16, wherein the lid and base plate act as a filter which causes periodic varying wave impedance of microwave or millimeter waves to prevent propagation of the microwave or millimeter waves through the box.

* * * * *